(12) United States Patent
Andry et al.

(10) Patent No.: US 8,735,251 B2
(45) Date of Patent: May 27, 2014

(54) THROUGH SILICON VIA AND METHOD OF FABRICATING SAME

(71) Applicant: Ultratech, Inc., San Jose, CA (US)

(72) Inventors: Paul Stephen Andry, Yorktown Heights, NY (US); Edmund Juris Sprogis, Underhill, VT (US); Cornelia Kang-I Tsang, Mohegan, NY (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 14/046,414

(22) Filed: Oct. 4, 2013

(65) Prior Publication Data

US 2014/0094007 A1    Apr. 3, 2014

Related U.S. Application Data

(62) Division of application No. 13/364,804, filed on Feb. 2, 2012, now Pat. No. 8,637,937, which is a division of application No. 12/188,228, filed on Aug. 8, 2008, now Pat. No. 8,138,036.

(51) Int. Cl.
*H01L 21/336* (2006.01)
*H01L 21/76* (2006.01)
*H01L 21/311* (2006.01)

(52) U.S. Cl.
USPC ........... 438/280; 438/296; 438/424; 438/430; 438/702

(58) Field of Classification Search
USPC .................. 438/280, 296, 424, 430, 702
See application file for complete search history.

(56) References Cited

U.S. PATENT DOCUMENTS

| | | | |
|---|---|---|---|
| 4,666,556 | A | 5/1987 | Fulton et al. |
| 4,690,729 | A | 9/1987 | Douglas |
| 5,933,748 | A | 8/1999 | Chou et al. |
| 5,998,292 | A | 12/1999 | Black et al. |
| 6,329,234 | B1 | 12/2001 | Ma et al. |
| 6,406,934 | B1 | 6/2002 | Glenn et al. |
| 6,836,020 | B2 | 12/2004 | Cheng et al. |

(Continued)

FOREIGN PATENT DOCUMENTS

WO    2007023947    3/2007

OTHER PUBLICATIONS

Notice of Allowance (Mail Date Oct. 30, 2009) for U.S. Appl. No. 12/188,230, filed Aug. 8, 2008, Confirmation No. 4600.

(Continued)

*Primary Examiner* — Ngan Ngo
(74) *Attorney, Agent, or Firm* — Allston L. Jones; Peters Verny, LLP

(57) ABSTRACT

A through silicon via structure and a method of fabricating the through silicon via. The method includes: (a) forming a trench in a silicon substrate, the trench open to a top surface of the substrate; (b) forming a silicon dioxide layer on sidewalls of the trench, the silicon dioxide layer not filling the trench; (c) filling remaining space in the trench with polysilicon; after (c), (d) fabricating at least a portion of a CMOS device in the substrate; (e) removing the polysilicon from the trench, the dielectric layer remaining on the sidewalls of the trench; (f) re-filling the trench with an electrically conductive core; and after (f), (g) forming one or more wiring layers over the top surface of the substrate, a wire of a wiring level of the one or more wiring levels closest to the substrate contacting a top surface of the conductive core.

11 Claims, 15 Drawing Sheets

(56) References Cited

U.S. PATENT DOCUMENTS

| | | | |
|---|---|---|---|
| 7,005,388 B1 | 2/2006 | Hopper et al. | |
| 7,056,813 B2 | 6/2006 | Morrow et al. | |
| 7,071,098 B2 | 7/2006 | Kirby et al. | |
| 7,141,855 B2 | 11/2006 | Chien | |
| 7,223,684 B2 | 5/2007 | McDevitt et al. | |
| 7,224,051 B2 | 5/2007 | Farnworth et al. | |
| 7,259,454 B2 | 8/2007 | Tanida et al. | |
| 7,271,491 B1 | 9/2007 | Akram | |
| 7,276,787 B2 | 10/2007 | Edelstein et al. | |
| 7,482,272 B2 | 1/2009 | Trezza | |
| 7,488,680 B2 | 2/2009 | Andry et al. | |
| 7,659,202 B2 | 2/2010 | Trezza | |
| 7,674,705 B2 | 3/2010 | Stamper | |
| 7,678,696 B2 | 3/2010 | Andry | |
| 7,701,060 B2 | 4/2010 | Tada et al. | |
| 7,767,493 B2 | 8/2010 | Trezza | |
| 7,781,886 B2 | 8/2010 | Trezza | |
| 7,786,592 B2 | 8/2010 | Trezza | |
| 7,791,124 B2 * | 9/2010 | Cheng et al. | 257/301 |
| 7,808,111 B2 | 10/2010 | Trezza | |
| 7,838,997 B2 | 11/2010 | Trezza | |
| 7,847,412 B2 | 12/2010 | Trezza | |
| 7,851,348 B2 | 12/2010 | Misra et al. | |
| 7,884,483 B2 | 2/2011 | Trezza et al. | |
| 7,919,870 B2 | 4/2011 | Trezza | |
| 7,932,584 B2 | 4/2011 | Trezza | |
| 7,939,876 B2 * | 5/2011 | Cheng et al. | 257/301 |
| 7,942,182 B2 | 5/2011 | Trezza et al. | |
| 7,946,331 B2 | 5/2011 | Trezza et al. | |
| 7,969,015 B2 | 6/2011 | Trezza | |
| 7,989,958 B2 | 8/2011 | Trezza et al. | |
| 8,035,198 B2 | 10/2011 | Ding et al. | |
| 8,093,729 B2 | 1/2012 | Trezza | |
| 8,110,464 B2 * | 2/2012 | Dyer et al. | 438/243 |
| 8,154,131 B2 | 4/2012 | Trezza et al. | |
| 2001/0055846 A1 * | 12/2001 | Beckmann et al. | 438/243 |
| 2005/0236669 A1 | 10/2005 | Chien | |
| 2005/0248002 A1 | 11/2005 | Newman et al. | |
| 2005/0275104 A1 | 12/2005 | Stamper | |
| 2006/0001174 A1 | 1/2006 | Matsui | |
| 2006/0006539 A1 | 1/2006 | Matsui et al. | |
| 2006/0105496 A1 | 5/2006 | Chen et al. | |
| 2006/0118965 A1 | 6/2006 | Matsui | |
| 2006/0154438 A1 | 7/2006 | Kishimoto et al. | |
| 2006/0197119 A1 | 9/2006 | Chinthakindi et al. | |
| 2006/0214298 A1 | 9/2006 | Huang et al. | |
| 2006/0275946 A1 | 12/2006 | MacNamara et al. | |
| 2007/0045779 A1 | 3/2007 | Hiatt | |
| 2007/0048896 A1 | 3/2007 | Andry et al. | |
| 2007/0120241 A1 | 5/2007 | Trezza et al. | |
| 2007/0190692 A1 | 8/2007 | Erturk et al. | |
| 2007/0196948 A1 | 8/2007 | Trezza | |
| 2007/0197018 A1 | 8/2007 | Chen et al. | |
| 2008/0079131 A1 | 4/2008 | Kim et al. | |
| 2008/0099870 A1 | 5/2008 | Wilson | |
| 2009/0215237 A1 | 8/2009 | Disney et al. | |
| 2009/0244954 A1 | 10/2009 | Cannon et al. | |
| 2009/0256185 A1 * | 10/2009 | Cheng et al. | 257/301 |
| 2009/0267126 A1 | 10/2009 | Wang et al. | |
| 2010/0032742 A1 * | 2/2010 | Barth et al. | 257/301 |
| 2010/0032764 A1 | 2/2010 | Andry et al. | |
| 2010/0032808 A1 | 2/2010 | Ding et al. | |
| 2010/0032810 A1 | 2/2010 | Ding et al. | |
| 2010/0032811 A1 | 2/2010 | Ding et al. | |
| 2010/0035430 A1 | 2/2010 | Andry et al. | |
| 2010/0090307 A1 | 4/2010 | Moriya et al. | |
| 2011/0012084 A1 * | 1/2011 | Lai et al. | 257/5 |
| 2011/0012186 A1 * | 1/2011 | Violette | 257/316 |
| 2011/0012196 A1 | 1/2011 | Williams et al. | |
| 2012/0302061 A1 | 11/2012 | Arie et al. | |

OTHER PUBLICATIONS

Office Action (Mail Date Jul. 28, 2011) for U.S. Appl. No. 12/188,228, filed Aug. 8, 2008, Confirmation No. 4587.

Amendment filed Oct. 18, 2011 in response to Office Action (Mail Date Jul. 28, 2011) for U.S. Appl. No. 12/188,228, filed Aug. 8, 2008, Confirmation No. 4587.

Notice of Allowance (Mail Date Nov. 23, 2011) for U.S. Appl. No. 12/188,228, filed Aug. 8, 2008, Confirmation No. 4587.

Office Action (Mail Date Sep. 1, 2010) for U.S. Appl. No. 12/188,229, filed Aug. 8, 2008, Confirmation No. 4593.

Amendment filed Nov. 23, 201 in response to Office Action (Mail Date Sep. 1, 2010) for U.S. Appl. No. 12/188,229, filed Aug. 8, 2008, Confirmation No. 4593.

Final Office Action (Mail Date Feb. 1, 2011) for U.S. Appl. No. 12/188,229, filed Aug. 8, 2008, Confirmation No. 4593.

Amendment After Final filed Mar. 31, 2011 in response to Final Office Action (Mail Date Feb. 1, 2011) for U.S. Appl. No. 12/188,229, filed Aug. 8, 2008, Confirmation No. 4593.

Advisory Action (Mail Date Apr. 18, 2011) for U.S. Appl. No. 12/188,229, filed Aug. 8, 2008, Confirmation No. 4593.

Amendment After Final filed May 17, 2011 in response to Advisory Action (Mail Date Apr. 18, 2011) for U.S. Appl. No. 12/188,229, filed Aug. 8, 2008, Confirmation No. 4593.

Notice of Allowance (Mail Date Jun. 9, 2011) for U.S. Appl. No. 12/188,229, filed Aug. 8, 2008, Confirmation No. 4593.

Office Action (Mail Date Apr. 28, 2011) for U.S. Appl. No. 12/188,241, filed Aug. 8, 2008, Confirmation No. 4625.

Amendment filed Aug. 24, 2011 in response to Office Action (Mail Date Apr. 28, 2011) for U.S. Appl. No. 12/188,241, filed Aug. 8, 2008, Confirmation No. 4625.

Final Office Action (Mail Date Oct. 26, 2011) for U.S. Appl. No. 12/188,241, filed Aug. 8, 2008, Confirmation No. 4625.

Amendment After Final filed Dec. 21, 2011 in response to Final Office Action (Mail Date Oct. 26, 2011) for U.S. Appl. No. 12/188,241, filed Aug. 8, 2008, Confirmation No. 4625.

Amendment filed May 16, 2012 in response to Office Action (Mail Date Feb. 22, 2012) for U.S. Appl. No. 12/188,236; filed Aug. 8, 2008; Confirmation No. 4618.

Notice of Allowance (Mail Date Jul. 18, 2012) for U.S. Appl. No. 12/188,236; filed Aug. 8, 2008; Confirmation No. 4618.

Advisory Action (Mail Date Jan. 23, 2012) for U.S. Appl. No. 12/188,241, filed Aug. 8, 2008, Confirmation No. 4625.

Notice of Appeal filed Feb. 27, 2012 for U.S. Appl. No. 12/188,241, filed Aug. 8, 2008, Confirmation No. 4625.

Appeal Brief filed Apr. 6, 2012 for U.S. Appl. No. 12/188,241, filed Aug. 8, 2008, Confirmation No. 4625.

Office Action (Mail Date Feb. 22, 2012) for U.S. Appl. No. 12/188,236, filed Aug. 8, 2008; Confirmation No. 4618.

* cited by examiner

US 8,735,251 B2

THROUGH SILICON VIA AND METHOD OF FABRICATING SAME

RELATED APPLICATIONS

This Application is a division of U.S. patent application Ser. No. 13/364,804 filed on Feb. 2, 2012, which is a division of U.S. patent application Ser. No. 12/188,228 filed on Aug. 8, 2008.

FIELD OF THE INVENTION

The present invention relates to the field of integrated circuits; more specifically, it relates to through it relates to through silicon vias for use in integrated circuit chips and the method of fabricating through silicon vias.

BACKGROUND OF THE INVENTION

To increase the density of devices using integrated circuit chips it is desirable to allow interconnections to be made to both the top and bottom surfaces of the integrated circuit chip. This requires formation of through silicon vias from the top to the bottom surface of the integrated chip that are compatible with complementary metal oxide silicon (CMOS) technology. Many existing through via schemes are either difficult to integrate into CMOS fabrication processes or result in unacceptable degradation of signals propagating from/to the front surface of the integrated circuit chip to/from the bottom surface of the integrated circuit chip. Accordingly, there exists a need in the art to overcome the deficiencies and limitations described hereinabove.

SUMMARY OF THE INVENTION

A first aspect of the present invention is a method, comprising: (a) forming a trench in a silicon substrate, the trench open to a top surface of the substrate; (b) forming a silicon dioxide layer on sidewalls of the trench, the silicon dioxide layer not filling the trench; (c) filling remaining space in the trench with polysilicon; after (c), (d) fabricating at least a portion of a CMOS device in the substrate; (e) removing the polysilicon from the trench, the dielectric layer remaining on the sidewalls of the trench; (f) re-filling the trench with an electrically conductive core; and after (f), (g) forming one or more wiring layers over the top surface of the substrate, a wire of a wiring level of the one or more wiring levels closest to the substrate contacting a top surface of the conductive core.

A second aspect of the present invention is a method, comprising: (a) forming an oxidation barrier layer on a top surface of a silicon substrate and forming an opening in the barrier layer, a region of the top surface of the substrate exposed in a bottom of the opening; (b) forming a trench in the silicon substrate where the substrate is not protected by the barrier layer, the trench open to a top surface of the substrate; (c) forming a silicon dioxide layer on sidewalls of the trench, the silicon dioxide layer not filling the trench; (d) removing the oxidation barrier layer; (e) forming a hardmask layer on the top surface of the substrate and all exposed surfaces of the silicon dioxide layer; (f) filling remaining space in the trench with polysilicon after which a top surface of the polysilicon is coplanar with a top surface of the hardmask layer; after (f), (g) forming a source, drain and channel region of a field effect transistor in the substrate, a gate dielectric on the channel region and a gate electrode on the gate dielectric; (h) forming a passivation layer over the hardmask layer and the field effect transistor; (i) forming metal contacts to respective the source, the drain and the gate electrode of the field effect transistor through the passivation layer, top surfaces of the metal contacts coplanar with a top surface of the passivation layer; (j) forming an opening in the passivation layer over the trench and removing the polysilicon from the trench, the dielectric layer and the hardmask layer remaining on the sidewalls of the trench; (k) re-filling the trench with an electrically conductive core, the dielectric layer and the hardmask layer remaining on the sidewalls of the trench, a top surface of the core coplanar with the top surface of the passivation layer; and after (k), (l) forming one or more wiring layers over the passivation layer, a wire of a wiring level of the one or more wiring levels closest to the substrate contacting the top surface of the conductive core.

A third aspect of the present invention is a structure comprising: a trench in a silicon substrate; a silicon dioxide layer on sidewalls of the trench, the silicon dioxide layer not filling the trench, the silicon dioxide layer having a thickness variation of less than about 10% between thinnest and thickest regions of the silicon dioxide layer on the sidewalls of the trench; an electrically conductive core filling remaining space in the trench at least a portion of a CMOS device in the substrate; and one or more wiring layers over the top surface of the substrate, a wire of a wiring level of the one or more wiring levels closest to the substrate contacting a top surface of the conductive core.

A fourth aspect of the present invention is a structure, comprising: a trench in a silicon substrate; a silicon dioxide layer on sidewalls of the trench, the silicon dioxide layer not filling the trench; a dielectric layer on the top surface of the substrate and on the silicon dioxide layer, the dielectric layer not filling the trench; an electrically conductive core filling remaining space in the trench, a source, drain and channel region of a field effect transistor in the substrate, a gate dielectric on the channel region and a gate electrode on the gate dielectric; a passivation layer over dielectric layer and the field effect transistor; the core extending through the passivation layer, a top surface of the core coplanar with the top surface of the passivation layer; metal contacts to respective the source, the drain and the gate electrode of the field effect transistor through the passivation layer, top surfaces of the metal contacts coplanar with a top surface of the passivation layer; and one or more wiring layers over the passivation layer, a wire of a wiring level of the one or more wiring levels closest to the substrate contacting the top surface of the conductive core.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
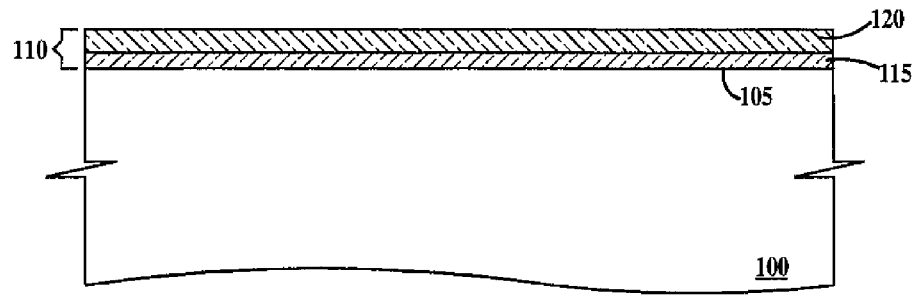
FIGS. 1A through 1M are cross-sectional views illustrating initial fabrication steps of a silicon through via according to embodiments of the present invention.

FIGS. 1A through 1M are cross-sectional views illustrating initial fabrication steps of a silicon through via according to embodiments of the present invention. In FIG. 1A, a single-crystal silicon substrate 100 has a top surface 105. In one example, substrate 100 has a <100> crystal alignment relative to top surface 105. In one example, substrate 100 is doped P-type. Formed on top surface 105 of substrate 100 is a barrier layer 110. In one example, barrier layer 110 comprises two or more individual layers. In one example and as illustrated in FIG. 1A, barrier layer 110 consists of a first layer 115 on substrate 100 and second layer 120 on the first layer. In one example, first layer 115 is silicon dioxide and is between about 5 nm and about 20 nm thick and second layer 120 is silicon nitride and is between about 100 nm and about 30 nm thick. In one example, barrier layer 110 comprises one or more of a layer of silicon dioxide, a layer of silicon nitride and a layer of silicon carbide. One purpose of barrier layer 110 is to act as a silicon oxidation barrier (i.e., a diffusion barrier for oxygen (as O, $O_2$ or $O_3$), hydrogen/oxygen compounds (e.g. $H_2O$), and other oxygen containing compounds (e.g., NO, $N_2O$)) for subsequent processing steps. Thus at least one layer of barrier layer 110 consists of a material that is an oxidation barrier. Barrier layer 110 also needs to be thick enough so if its surface oxidizes, there is enough thickness of material left to still act as an oxygen (or water) diffusion barrier. For illustrative purposes, first layer 115 and second layer 120 will be illustrated in subsequent drawing figures described infra.

Figure 1B:
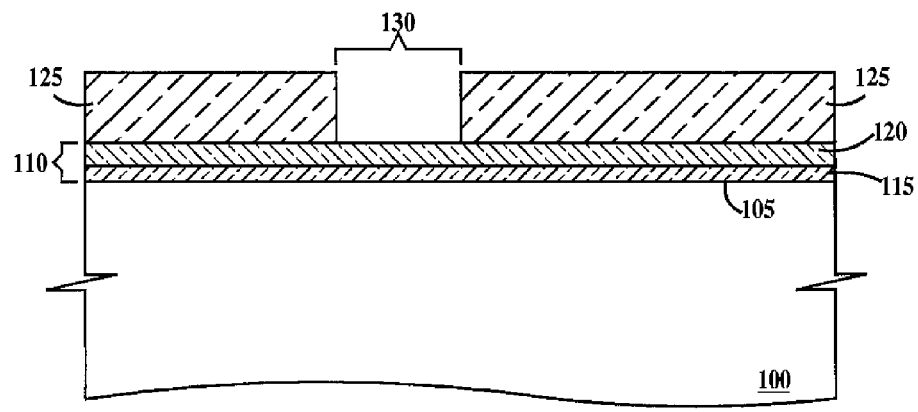

In FIG. 1B, a photoresist layer 125 is formed on barrier layer 110 and an opening 130 photolithographically formed in the photoresist layer to expose the pad dielectric in the bottom of the opening.

A photolithographic process is one in which a photoresist layer is applied to a surface, the photoresist layer exposed to actinic radiation through a patterned photomask and the exposed photoresist layer developed to form a patterned photoresist layer. When the photoresist layer comprises positive photoresist, the developer dissolves the regions of the photoresist exposed to the actinic radiation and does not dissolve the regions where the patterned photomask blocked (or greatly attenuated the intensity of the radiation) from impinging on the photoresist layer. When the photoresist layer comprises negative photoresist, the developer does not dissolve the regions of the photoresist exposed to the actinic radiation and does dissolve the regions where the patterned photomask blocked (or greatly attenuated the intensity of the radiation) from impinging on the photoresist layer. After further processing (e.g., an etch or an ion implantation), the patterned photoresist is removed. The photoresist layer may optionally be baked at one or more of prior to exposure to actinic radiation, between exposure to actinic radiation and development, after development.

Figure 1C:
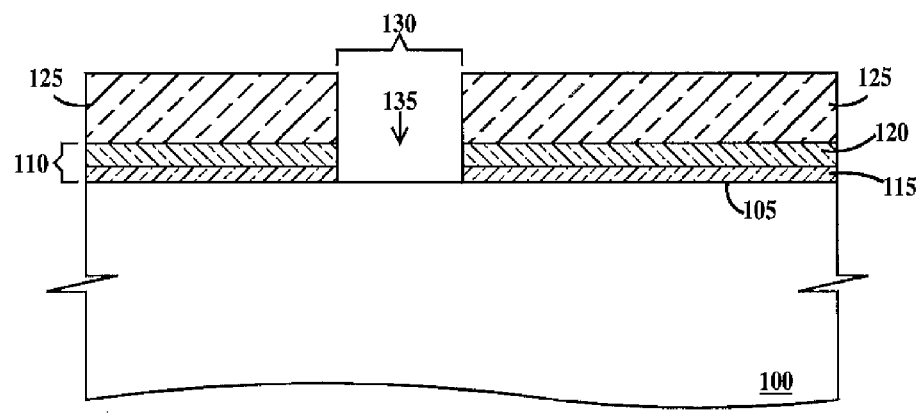

In FIG. 1C, an opening 135 is etched through barrier layer 110 where the barrier layer is exposed in opening 130 of photoresist layer 125. Top surface 105 of substrate 100 is exposed in the bottom of opening 135. In one example, opening 135 is formed by a reactive ion etch (RIE) process.

Figure 1D:
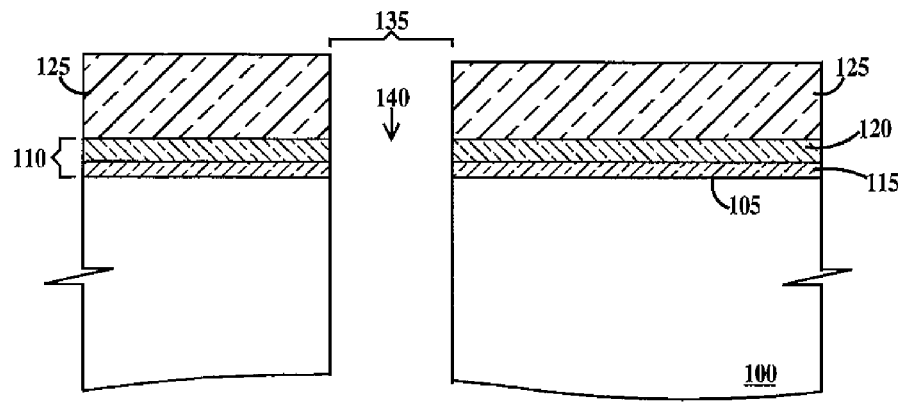

In FIG. 1D, a trench 140 is etched into substrate 100 in opening 135 in barrier layer 110. In one example, trench 140 is etched using a RIE process. One example of a suitable RIE process for etching trench 140 is known in the industry as the Bosch process (also known as pulsed or time-multiplexed plasma etching process).

Figure 1E:
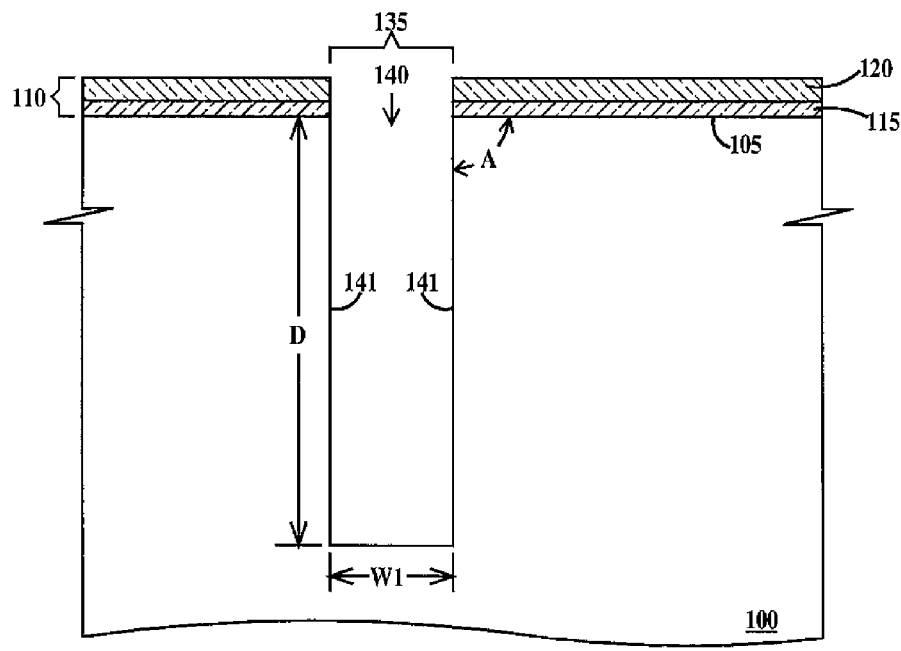

In FIG. 1E photoresist layer 135 is removed (see FIG. 1D). This may be done by dry stripping ashing (e.g., etching the photoresist layer in an oxygen plasma), wet stripping in an acid solution, or a combination of both dry and wet stripping. Trench 140 extends from top surface 105 a distance D into substrate 100 and has a substantially uniform (i.e., within about plus or minus 10% of W1) with essentially straight sidewalls 141 at an angle A measured relative to top surface 105 of substrate 100. In one example A is between about 85° and about 95°. In one example A is between about 88° and about 92°. As illustrated in FIG. 1E, A is equal to about 90°. It is advantageous that A be as close to 90° as possible. In one example D is between about 20 microns and about 200 microns and W1 is between about 1 micron and about 5 microns. Width is defined as a distance between the two closest and opposite sidewalls of a trench measured in a plane parallel to top surface of the substrate. For example, in a rectangular trench with straight sides, width is measured between and perpendicular to the long sides and a single width value is obtained. For example, in a rectangular trench with tapered sides, width is measured between and perpendicular to the long sides, however the width value will vary depending on which plane parallel to the top surface of the substrate the width is measured in but is still measured between the closest opposite sidewalls.

Figure 1F:
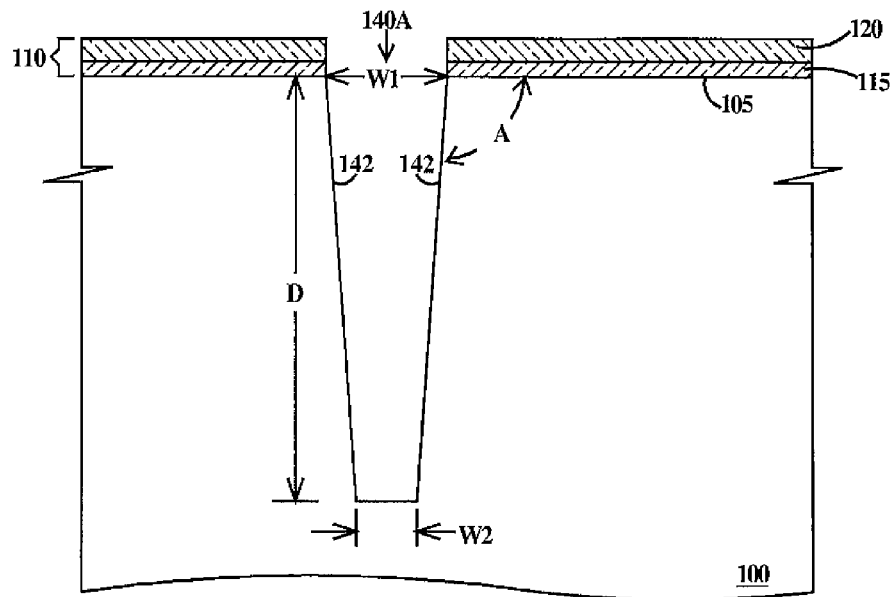

FIG. 1F illustrates a first alternative shaped trench. In FIG. 1F a trench 140A has a width Wi at the top of the trench and a width W2 at the bottom of the trench. W1 is greater than W2. In FIG. 1F, sidewalls 142 uniformly taper inward at angle A. As illustrated in FIG. 1F, A is greater than 90°.

Figure 1G:
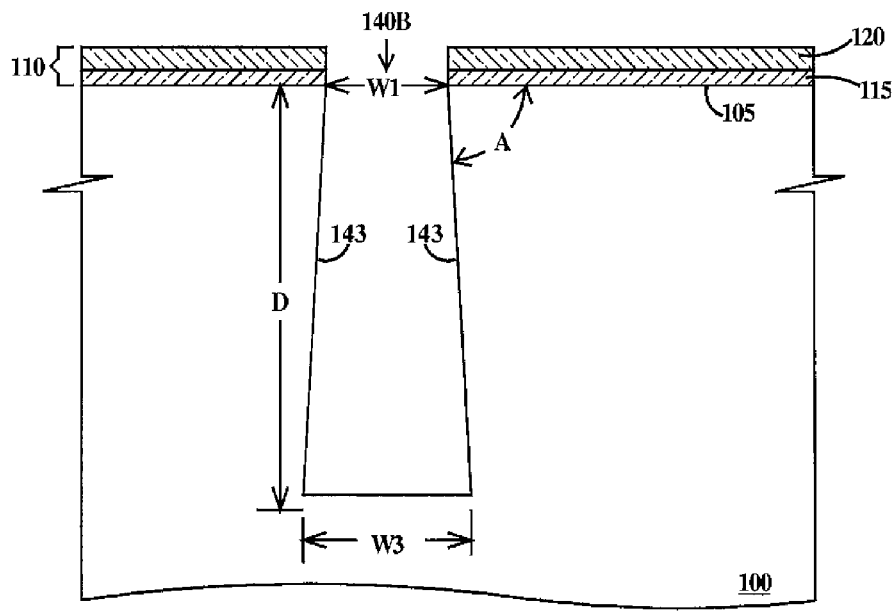

FIG. 1G illustrates a second alternative shaped trench. In FIG. 1G a trench 140B has a width W1 at the top of the trench and a width W3 at the bottom of the trench. W3 is greater than W1. In FIG. 1G, trench 140B has outwardly tappereing sidewalls 143 and a bulbus bottom 144. As illustrated in FIG. 1G, A is less than 90°. For illustrative purposes, trench 140 of FIG. 1E will be illustrated in subsequent drawing figures described infra.

Figure 1H:
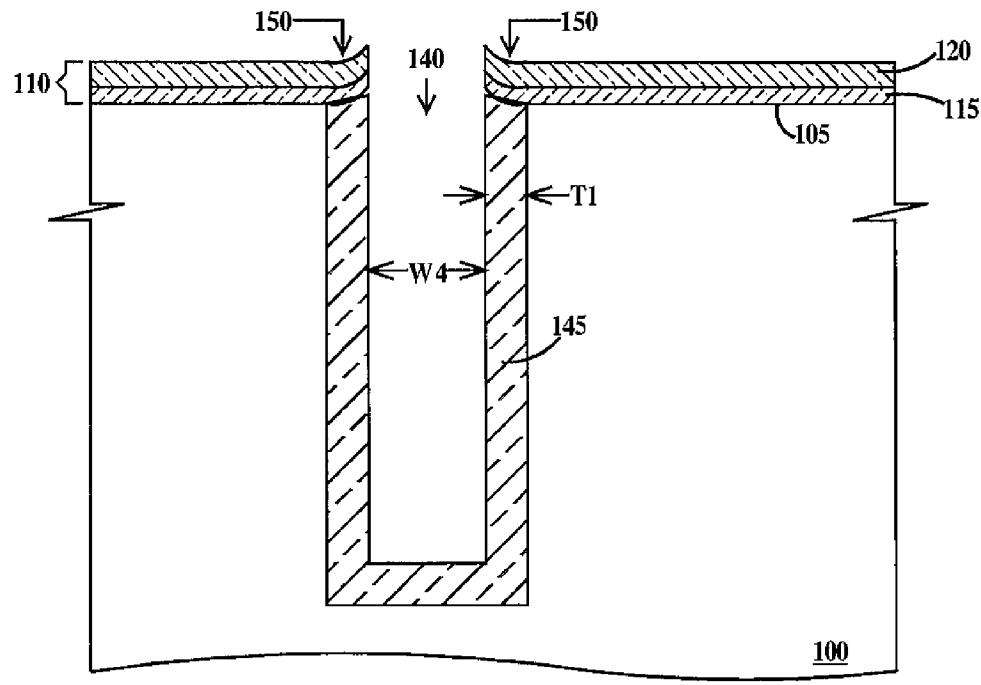

In FIG. 1H, a silicon dioxide layer 145 has been formed on the sides and bottom of trench 140. Silicon dioxide layer 145 is formed by an oxidation processes. Because silicon dioxide grows in both directions from top surface 105 immediately adjacent to trench 140, cusps 150 are formed in barrier layer 110 around the perimeter of trench 140. In one example, silicon dioxide layer 145 is formed by a wet oxidation using $H_2O$ at a temperature between about 1000° C. and about 1200° C. at room pressure (i.e., one atm). In one example, silicon dioxide layer 145 is formed by a dry oxidation using $O_2$ a temperature of between about 1000° C. and about 1200° C.) at room pressure. In one example, silicon dioxide layer 145 is formed in a high pressure (i.e., greater than one atm) using $O_2$ or $H_2O$ at a temperature between about 500° C. and about 800° C. Silicon dioxide layer 145 has a thickness of T1. Since silicon dioxide layer 145 is formed by oxidation, about half the thickness of the silicon dioxide layer is formed by consumption of silicon wherein about half the oxide growth is into the substrate from the original (FIG. 1E) sidewall of trench 140 and about half the oxide growth is into the trench from the original sidewall of the trench. A layer of silicon about (T1)/2 in thickness on the sidewalls and bottom of trench 140 has been consumed. Trench 140 now has a reduced width of W4 so Wi (see FIG. 1E) is about equal to W4+T1. In one example T1 is between 0.1 micron and about 1 micron and W4 is between about 0.8 microns and about 4.8 microns. In one example T1 is at least at least about 0.5 microns.

A feature of the embodiments of the present invention is to form silicon dioxide layer 145 with thickness variation of less than about 10% between thinnest and thickest (measured in a direction perpendicular to the sidewalls of the trench) regions of the silicon dioxide layer on the sidewalls of the trench which is not achievable in current CMOS compatible trench technology. A feature of the embodiments of the present invention is the ability to form silicon dioxide layer 145 with a thickness of about 0.5 micron or greater which is not achievable in current CMOS compatible trench technology. A feature of the embodiments of the present invention is to form silicon dioxide layer 145 with thickness variation of less than about 10% between thinnest and thickest (measured in a direction perpendicular to the sidewalls of the trench) regions of the oxide on the sidewalls of the trench and to form silicon dioxide layer 145 with a thickness of about 0.5 micron or greater which is not achievable in current CMOS compatible trench technology.

Figure 1I:
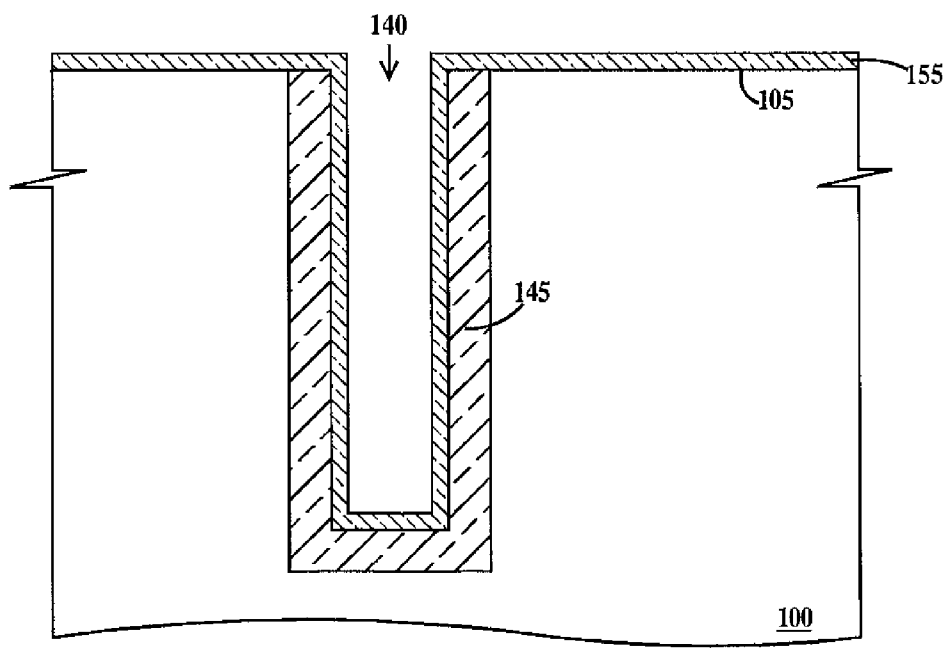

In FIG. 1I, optionally barrier layer 110 (see FIG. 1H) is removed and a hardmask layer 155 is deposited over top surface 105 of substrate 100 and all exposed surfaces of silicon dioxide layer 145. Hardmask layer 155 may comprise any the same materials and combination of materials as described supra for oxidation barrier 110 (see FIG. 1A). For illustrative purposes, hardmask layer 155 will be illustrated in subsequent drawing figures described infra.

Figure 1J:
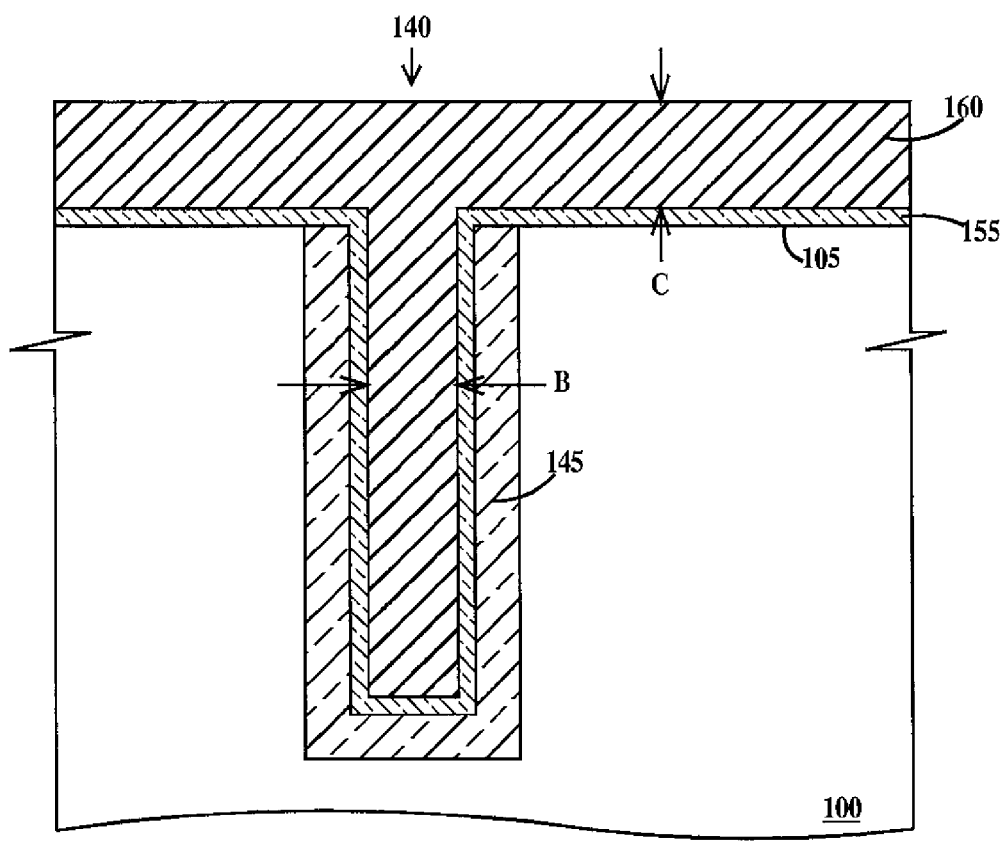

In FIG. 1J, a fill layer 160 is deposited on hardmask layer 155 (if present, otherwise on barrier layer 110, see FIG. 1H). In one example, fill layer 160 comprises polysilicon. Fill layer 160 fills all remaining space in trench 140. If the largest distance between any layers on the sidewalls of trench 140 is B and the thickness of fill layer 160 is C, then C may be about 1.5 times B to ensure trench 140 is completely filled the top with fill layer 160.

Figure 1K:
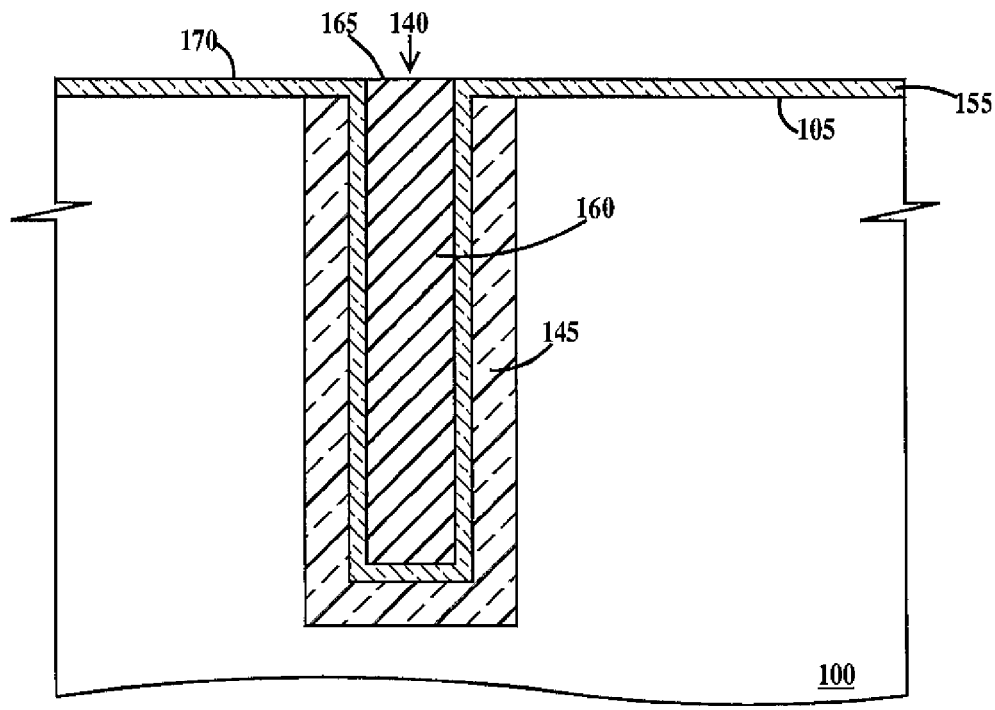

In FIG. 1K, a chemical-mechanical-polish (CMP) is performed so a top surface 165 of fill layer 160 in trench 140 is coplanar with a top surface 170 of hardmask layer 155. Thus, hardmask layer 155 also acts as a polish stop layer.

Figure 1L:
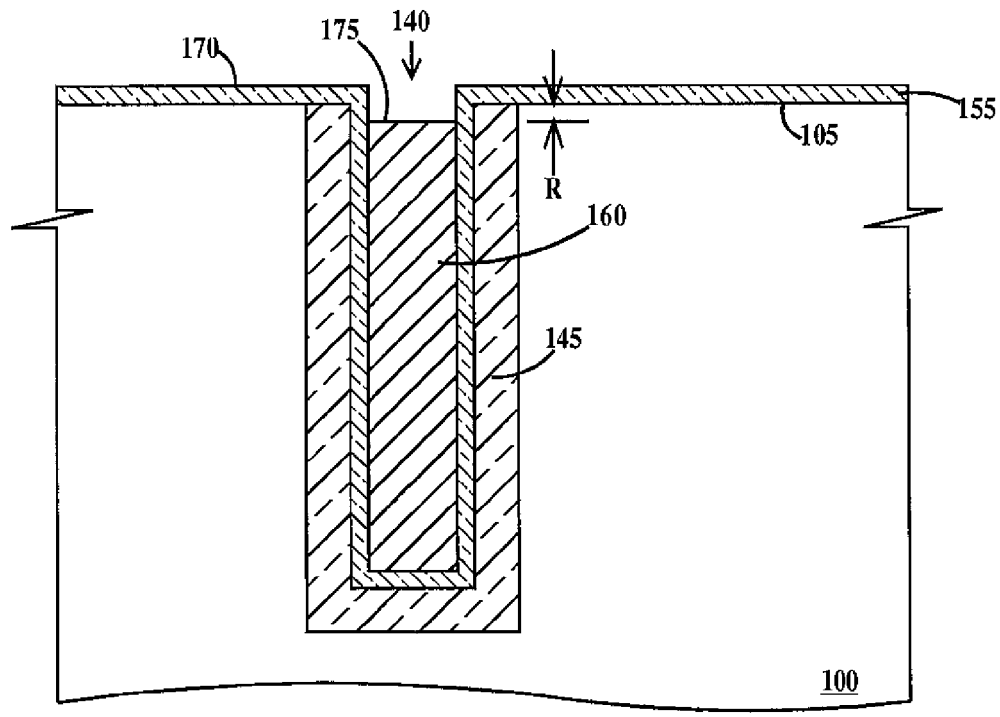

In FIG. 1L, an fill layer recess etch is performed to recess top surface 175 of fill layer 160 a distance R below top surface 105 of substrate 100. In one example, the fill recess etch is a reactive ion etch (RIE). In one, example, R is between about 50 nm and about 500 nm. If the optional fill recess etch is performed then in FIG. 1M, an optional dielectric cap 180 is formed in trench 140, filling the recess formed in FIG. 1L. A top surface 185 of cap 180 is coplanar with top surface 170 of hardmask layer 155. In one example, cap 180 is formed by a chemical-vapor-deposition (CVD) of silicon dioxide, followed by a CMP. For illustrative purposes, cap 180 will be illustrated in subsequent drawing figures described infra.

Figure 1M:
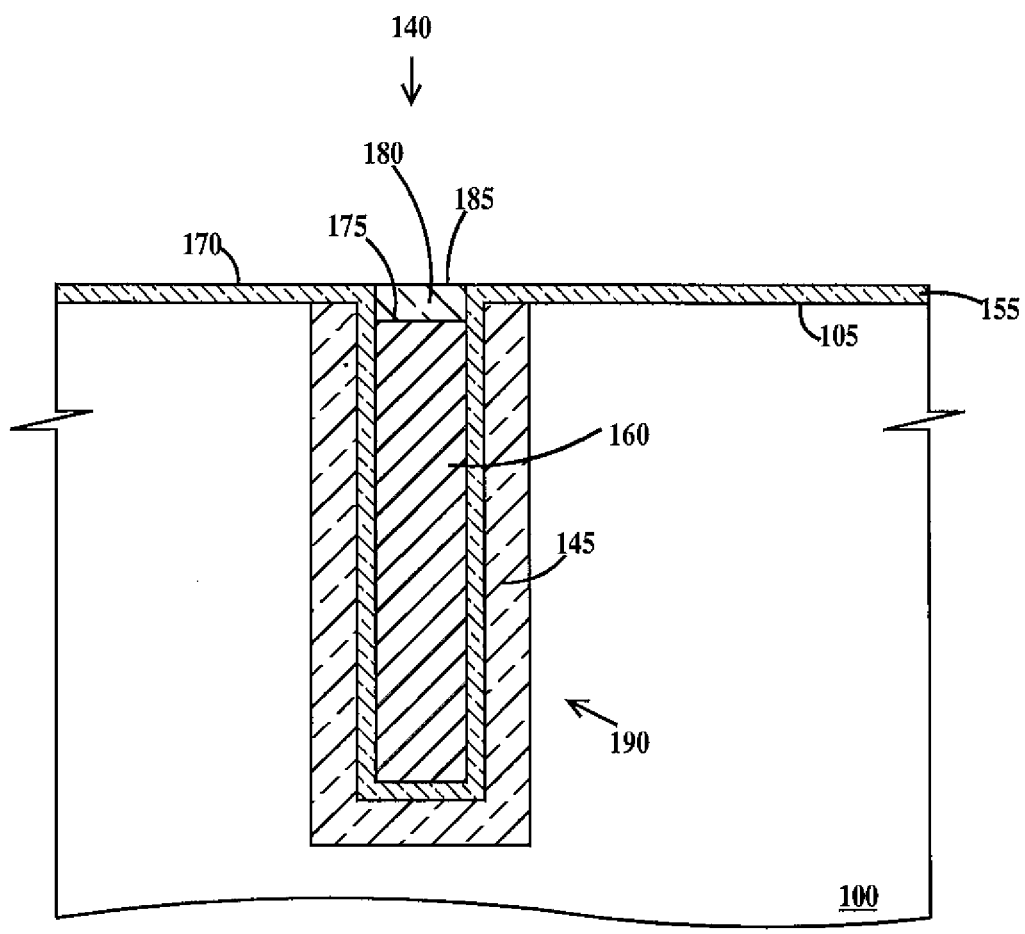

The structure in FIG. 1M may be considered a precursor through silicon via 190. The through silicon via is completed in steps illustrated in FIGS. 2A through 2G and described infra in conjunction with fabrication of CMOS devices and devices compatible with CMOS technology.

Figure 2A:
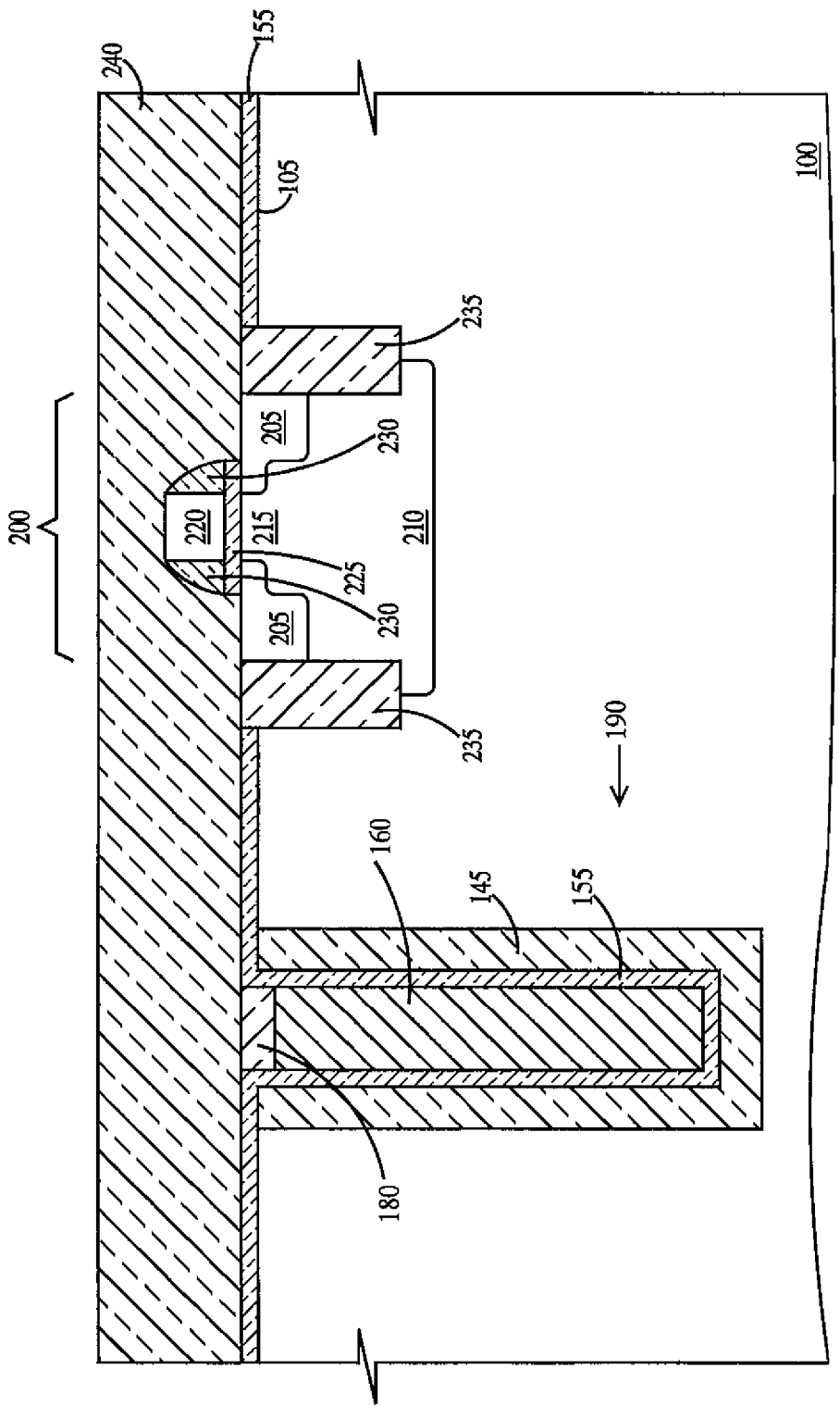
FIGS. 2A through 2H are cross-sectional views illustrating further fabrication steps of a through silicon via integrated with fabrication of CMOS integrated circuit devices and wiring according to embodiments of the present invention.

FIGS. 2A through 2H are cross-sectional views illustrating further fabrication steps of a through silicon via integrated with fabrication of CMOS integrated circuit devices and wiring according to embodiments of the present invention. In FIG. 2A, normal fabrication of an integrated circuit is started using substrate 100 having one or more precursor through silicon vias 190. In FIG. 2A, a field effect transistor (FET) 200 has been fabricated. FET 200 includes source/drains 205 formed in a well 210 and separate by channel region 215 under a gate electrode 220. Gate electrode 215 is separated from channel region by a gate dielectric 225. Dielectric sidewall spacers have been formed on the sidewalls of gate electrode 220. Source/drains 205 and well 210 are formed in substrate 100. Dielectric trench isolation 235 abuts the perimeter of well 210 and abuts source/drains 205. Gate dielectric 225, is formed on top surface 105 of substrate 100 and gate electrode 220 and spacers 230 are formed above top surface 105. Metal silicide contacts (not shown) are formed on the exposed surfaces of source/drains 205 and gate electrode 220. FET 200 is an example of a CMOS device that may be fabricated at this point in the process. Other types of CMOS devices or CMOS compatible (i.e., may be fabricated using CMOS process technology) include, bipolar transistors (including SiGe transistors), diodes, capacitors, trench capacitors, and resistors (including polysilicon and metal resistors). After fabrication of FET 200 (and/or FETs and other devices) a dielectric passivation layer 240 is deposited on hardmask layer 155, trench isolation 235 and exposed portions of FET 200. In one example, dielectric layer 240 is silicon dioxide. In one example, passivation layer 240 is formed by CVD using tetraethoxysilane (TEOS) (i.e., to form TEOS oxide). In one example, passivation layer 240 is formed by high pressure (greater than 1 atm) plasma deposition of oxide using silane and/or silane derivatives (i.e., to form an HDP oxide).

Figure 2B:
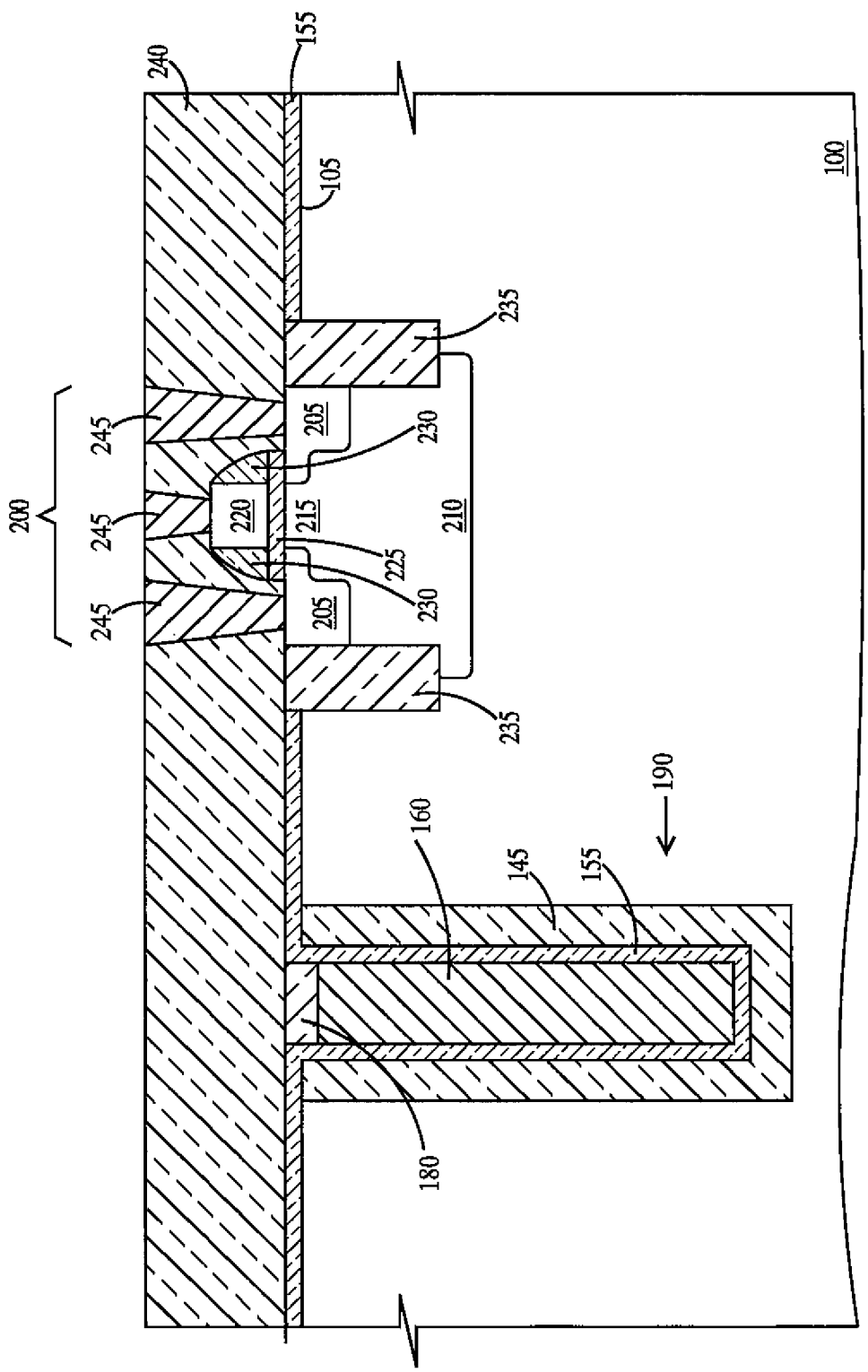

In FIG. 2B, metal contacts 245 to source/drains 205 and gate electrode 220 are formed through passivation layer 240. In one example, contacts 245 comprise tungsten. Metal contacts 245 have been formed using a damascene process.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene. The term wire is intended to include the term contact.

Figure 2C:
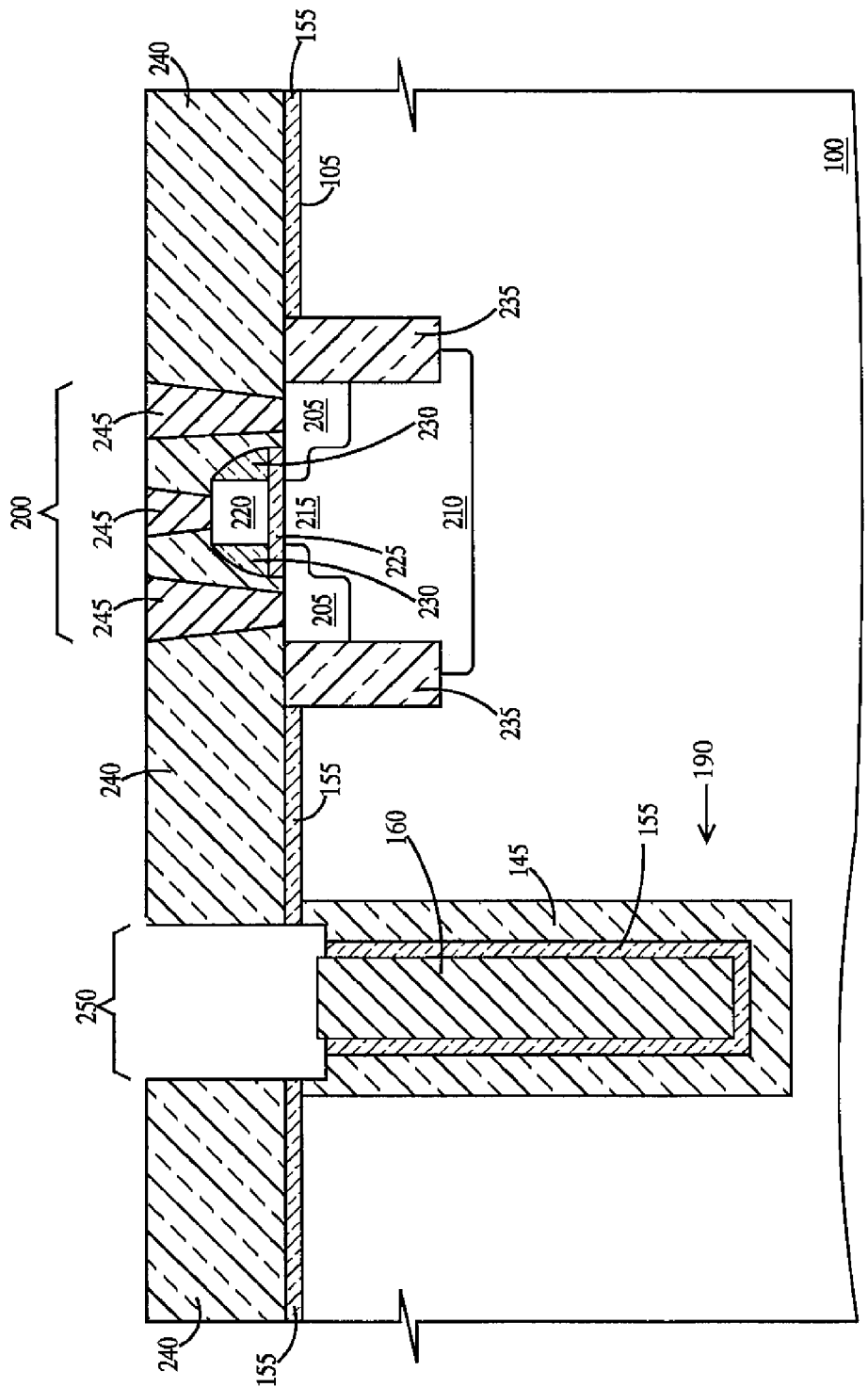

In FIG. 2C, a photolithographic/RIE process is used to form an opening 250 through passivation layer 140 and hardmask layer 155 over precursor through silicon via 190. Note that dielectric cap 180 (see FIG. 2B) is removed during this process as well as upper regions of hardmask layer 155 and silicon dioxide layer 145 exposed in opening 250.

Figure 2D:
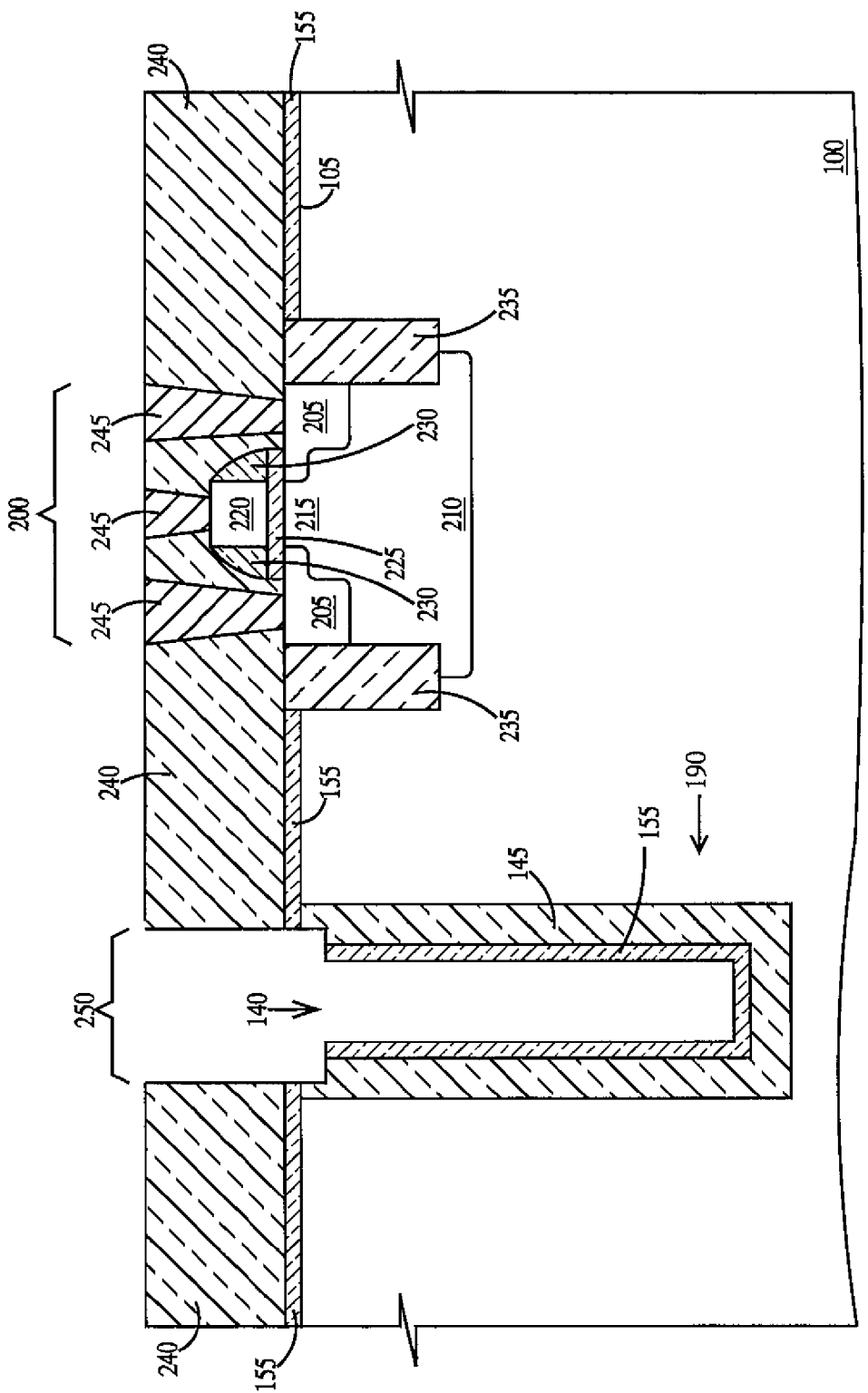

In FIG. 2D, fill layer 160 (see FIG. 2C) is removed from trench 140. In a first example, a polysilicon Bosch etch process (selective to the materials of hardmask layer 155 and silicon dioxide layer 145 is used to remove fill layer 160 (see FIG. 2C). In a second example, a wet etch using aqueous TMAH or aqueous ammonium hydroxide is used to 160 (see FIG. 2C). In a third example, a polysilicon Bosch etch process (selective to the materials of hardmask layer 155 and silicon dioxide layer 145 is used to remove fill layer 160 (see FIG. 2C) followed by a wet cleanup up etch in aqueous tetramethylammonium hydroxide (TMAH) or aqueous ammonium hydroxide.

Figure 2E:
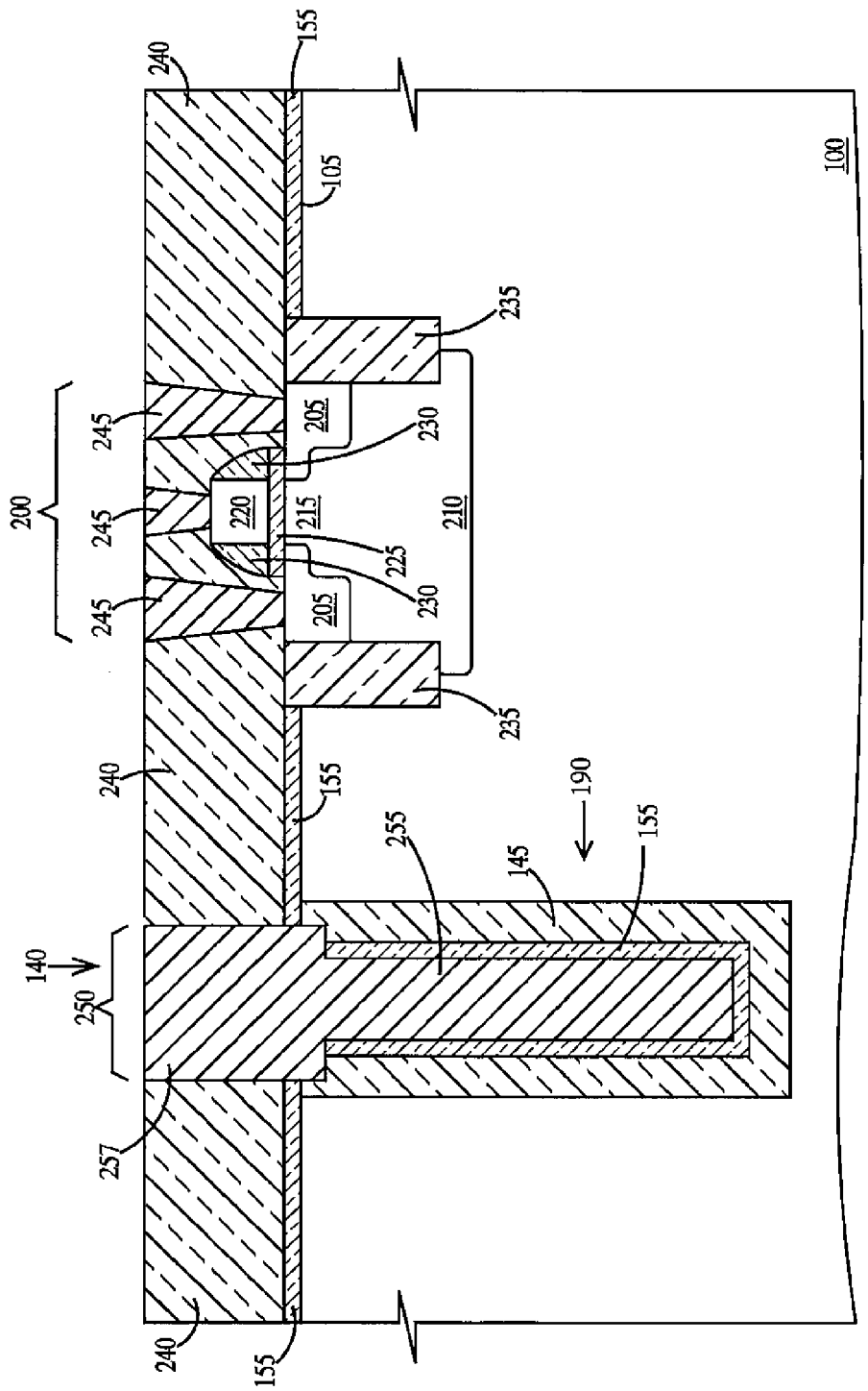

In FIG. 2E, an electrically conductive core 255 completely fills the space in trench 140 and opening 150. A top surface of core 255 is coplanar with a top surface of passivation layer 240. Core 255 has been formed using a damascene process. In one example, core 255 comprises a metal. In one example, core 255 comprises a refractory metal. Refractory metals are a class of metals extraordinarily resistant to heat, wear, and corrosion. The five refractory metals are: Tungsten (W), Molybdenum (Mo), Niobium (Nb), Tantalum (Ta), and Rhenium (Re). In one example, core 255 comprises tungsten, tantalum or a combination thereof. In one example, core 255 comprises copper or a combination of copper and tantalum. In one example, core 255 comprises doped polysilicon. This completes fabrication of an integrated circuit through what is termed the front-end-of-line (FEOL) operations or simply through FEOL. Core 255 includes an integral contact region 257 in passivation layer 240.

Figure 2F:
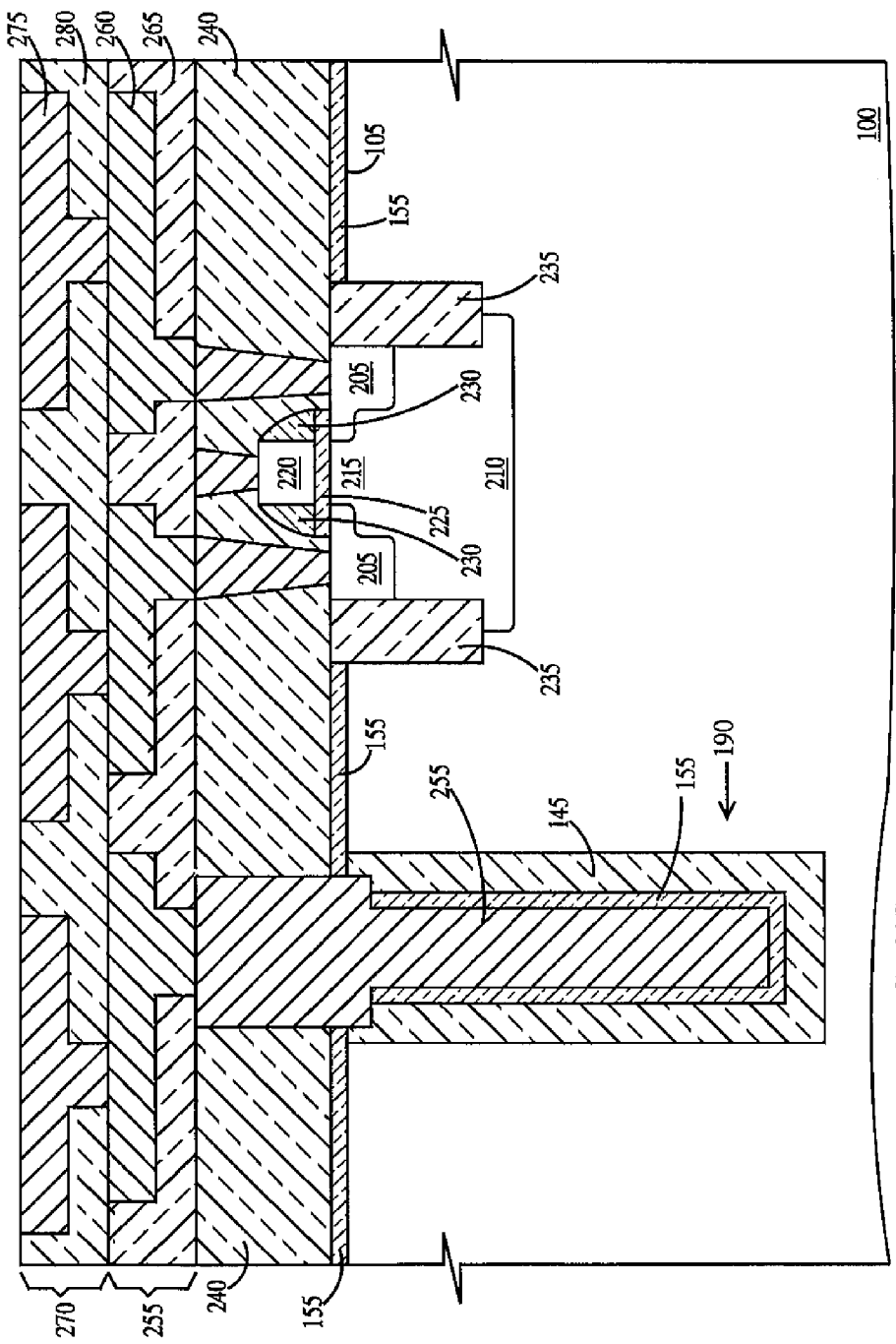

In FIG. 2F, fabrication of the integrated circuit is complete by the addition of one or more wiring levels during what is termed back-end-of line BEOL operations or simply BEOL. In FIG. 2F, two wiring levels have been added. A first wiring level 255 includes dual damascene wires 260 formed in an interlevel dielectric (ILD) layer 260.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface the dielectric layer to form dual-damascene wires and dual-damascene wires having integral dual-damascene vias. In some dual damascene processes the trench is formed first followed by forming the via opening.

Alternatively, wires 265 may be formed using a single damascene processes for vias and a single damascene process for wires (but ILD 255 would comprise two dielectric layers). A second wiring level 270 includes dual damascene wires 275 formed in an ILD layer 280. This completes BEOL fabrication of the integrated circuit.

Figure 2G:
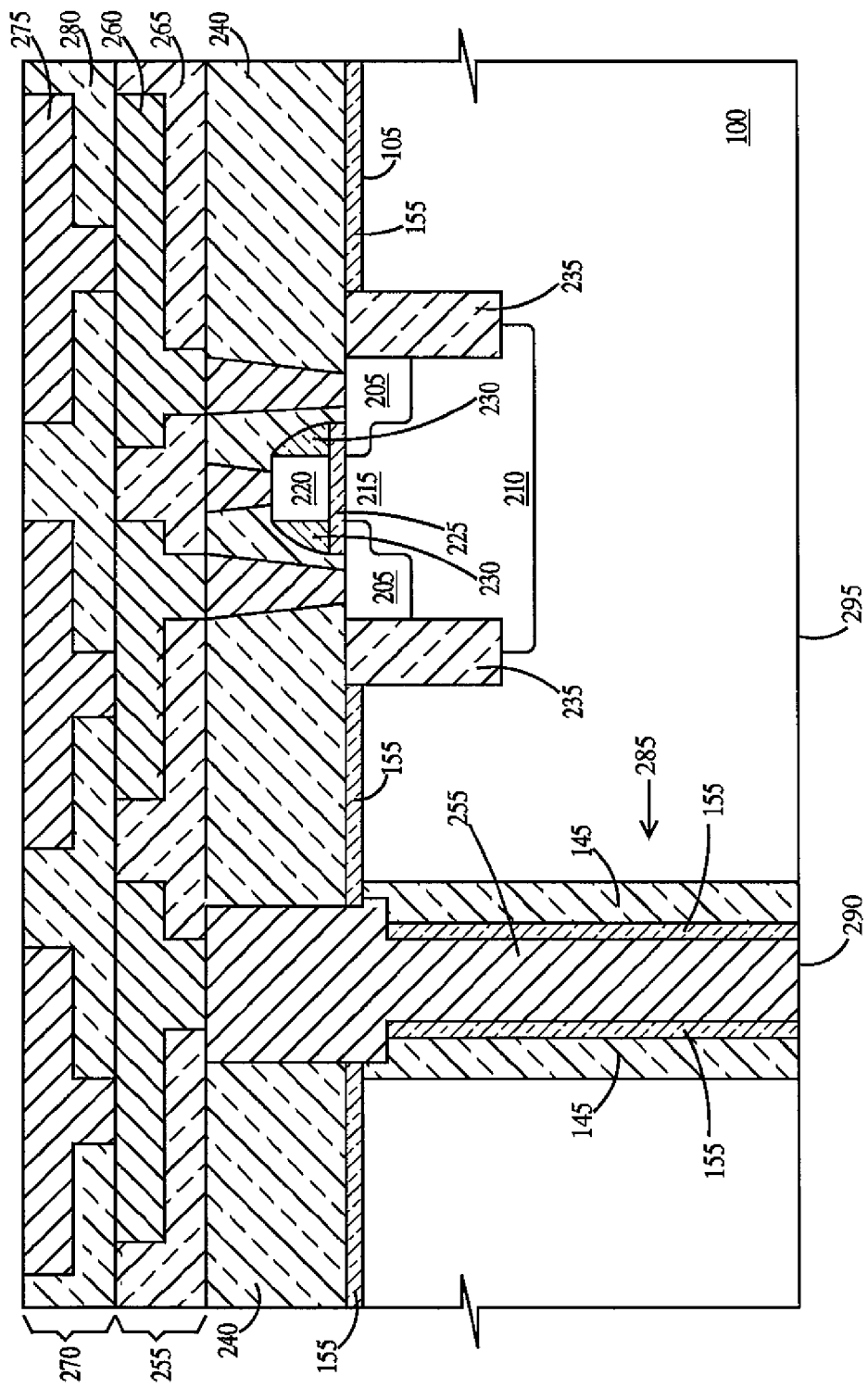

Subsequent to BEOL, further operations are performed. In FIG. 2G, a backside grinding and/or CMP has been performed to thin substrate 100 and expose a bottom surface 290 of core 255 and complete fabrication of through silicon via 285. Bottom surface 190 of core 255 is coplanar with a bottom surface 295 of substrate 100.

Various interconnect structures may now be made to wires 275 and through silicon via 285 such as forming solder bump connections to core 290 and wires 275. Examples of such interconnect structures are illustrated in FIG. 2H.

Figure 2H:
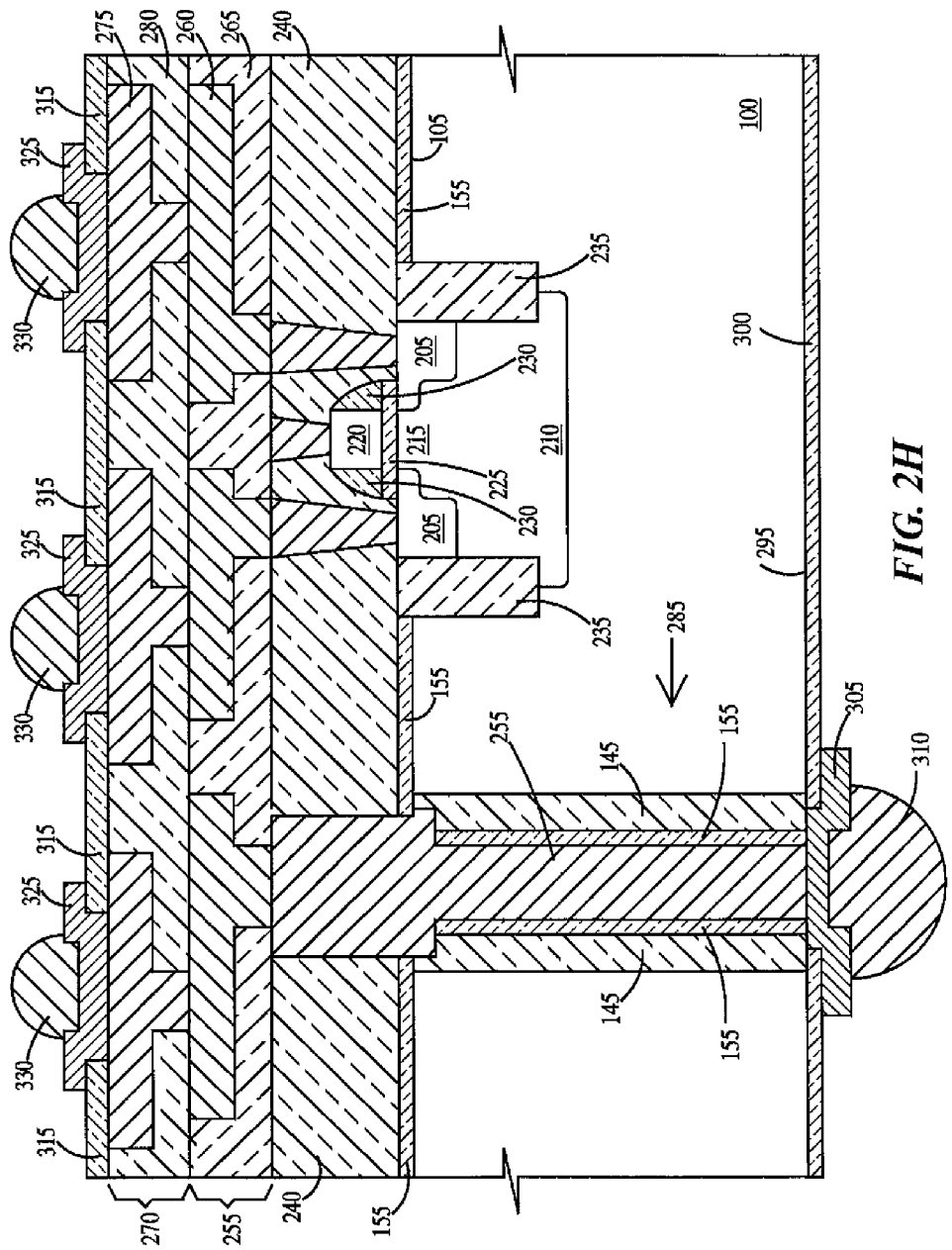

In FIG. 2H, In FIG. 2H a dielectric bottom passivation layer 300 is formed on bottom surface 295 of substrate 100. An electrically conductive bottom pad 305 contacts core 255 through an opening in bottom passivation layer 300 over through silicon via A bottom solder bump 310 is formed on bottom pad 305. Electrically conductive top pads 325 contacts wires 275 through openings in a top passivation layer 315 over through wires 275. Top solder bumps 330 are formed on top pads 325. While a single through via 285 is connected to pad 305, two or more through silicon vias may be connected to pad 305 and thus share a single bottom interconnection.

Thus, fabrication of a through wafer via according to embodiments of the present invention comprised the steps of (1) forming a through silicon via precursor structure prior to FEOL, (2) modifying the through silicon via precursor structure by adding a core conductor during FEOL, and (3) completing the through silicon via after BEOL.

Thus the embodiments of the present invention provide through silicon vias and methods of fabricating through silicon vias that are compatible with CMOS technology and having superior insulator thickness from the top surface of the integrated circuit chip to the bottom surface of the integrated circuit then currently obtainable in the industry.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. A method, comprising:
(a) forming an oxidation barrier layer on a top surface of a silicon substrate and forming an opening in said barrier layer, a region of said top surface of said substrate exposed in a bottom of said opening;
(b) forming a trench in said silicon substrate where said substrate is not protected by said barrier layer, said trench open to a top surface of said substrate;
(c) forming a silicon dioxide layer on sidewalls of said trench, said silicon dioxide layer not filling said trench;
(d) removing said oxidation barrier layer;
(e) forming a hardmask layer on said top surface of said substrate and all exposed surfaces of said silicon dioxide layer;
(f) filling remaining space in said trench with polysilicon after which a top surface of said polysilicon is coplanar with a top surface of said hardmask layer;
after (f), (g) forming a source, drain and channel region of a field effect transistor in said substrate, a gate dielectric on said channel region and a gate electrode on said gate dielectric;
(h) forming a passivation layer over said hardmask layer and said field effect transistor;
(i) forming metal contacts to respective said source, said drain and said gate electrode of said field effect transistor through said passivation layer, top surfaces of said metal contacts coplanar with a top surface of said passivation layer;
(j) forming an opening in said passivation layer over said trench and completely removing said polysilicon from said trench, said dielectric layer and said hardmask layer remaining on said sidewalls of said trench;
(k) re-filling said trench with an electrically conductive core, said electrically conductive core extending above a top surface of said substrate, said dielectric layer and said hardmask layer remaining on said sidewalls of said trench, a top surface of said core coplanar with said top surface of said passivation layer; and
after (k), (l) forming a stack of two or more damascene wiring levels from a first wiring level to a last wiring level over said passivation layer, a wire of a wiring level said first wiring level contacting said top surface of said conductive core.

2. The method of claim 1, further including:
(m) thinning said substrate from a bottom surface to form a thinned substrate, after said thinning a bottom surface of said core coplanar with a bottom surface of said thinned substrate.

3. The method of claim 2, further including:
forming a dielectric layer on said bottom surface of said thinned substrate;
forming an opening in said bottom passivation layer, said core exposed in a bottom of said opening;
forming a metal pad on said dielectric layer; a perimeter of said pad overlapping a perimeter of said opening, said pad contacting said bottom surface of said core; and
forming a solder bump on said bottom metal pad.

4. The method of claim 1, wherein said silicon dioxide layer is formed by thermal oxidation of said substrate exposed on said sidewalls of said trench.

5. The method of claim 1, wherein said silicon dioxide layer is at least about 0.5 micron thick.

6. The method of claim 5, wherein said silicon dioxide layer has a thickness variation of less than about 10% between thinnest and thickest regions of said silicon dioxide layer on said sidewalls of said trench.

7. The method of claim 1, wherein:
(a) includes forming a patterned photoresist layer on a top surface of said barrier layer and etching said barrier layer to form said opening in said barrier layer where said barrier layer is not protected by said patterned photoresist layer; and
(b) includes forming said trench by plasma etching said substrate exposed in said opening and after etching said trench and before (c), removing said photoresist layer.

8. The method of claim 1, further including:
between (f) and (g), removing an upper region of said polysilicon in said trench and forming a dielectric cap on remaining polysilicon in said trench and (j) includes removing said dielectric cap.

9. The method of claim 1, wherein said trench has straight sidewalls perpendicular to said top surface of said wafer and a substantially uniform width.

10. The method of claim 1, wherein said trench has straight sidewalls tapering toward each other such that a first width of said trench at said top surface of said trench is greater than a second width of said trench at a bottom of said trench.

11. The method of claim 1, wherein said trench has straight sidewalls tapering away from each other, such that a first width of said trench at said top surface of said trench is less than a second width of said trench at a bottom of said trench.

* * * * *